(12) United States Patent
Shakuda

(10) Patent No.: US 7,592,633 B2
(45) Date of Patent: Sep. 22, 2009

(54) SEMICONDUCTOR LIGHT EMITTING DEVICE

(75) Inventor: Yukio Shakuda, Kyoto (JP)

(73) Assignee: Rohm Co., Ltd., Kyoto-shi (JP)

( * ) Notice: Subject to any disclaimer, the term of this patent is extended or adjusted under 35 U.S.C. 154(b) by 39 days.

(21) Appl. No.: 11/434,111

(22) Filed: May 16, 2006

(65) Prior Publication Data

US 2006/0261361 A1    Nov. 23, 2006

(30) Foreign Application Priority Data

May 18, 2005 (JP) ............................. 2005-145853

(51) Int. Cl.
*H01L 29/18* (2006.01)
*H01L 29/22* (2006.01)

(52) U.S. Cl. .............................. 257/88; 257/81; 257/79; 257/90; 257/93; 257/99; 257/100; 438/22

(58) Field of Classification Search .................. 257/79, 257/81, 88, 89, 90, 93, 99, 100; 438/22
See application file for complete search history.

(56) References Cited

U.S. PATENT DOCUMENTS

| 2004/0173802 A1* | 9/2004 | Yukimoto ..................... 257/79 |
| 2005/0269579 A1* | 12/2005 | Yukimoto et al. ............. 257/81 |
| 2006/0175621 A1* | 8/2006 | Ohtsuka et al. ............... 257/88 |

FOREIGN PATENT DOCUMENTS

| JP | 07-312443 | 11/1995 |
| JP | 10-083701 | 3/1998 |
| JP | 2000-101136 | 4/2000 |
| JP | 2004-273746 | 9/2004 |

OTHER PUBLICATIONS

Foreign office action issued on Nov. 11, 2008 JP Application No. 2005-145853.

* cited by examiner

*Primary Examiner*—Kenneth A Parker
*Assistant Examiner*—Joseph Nguyen
(74) *Attorney, Agent, or Firm*—Rabin & Berdo, P.C.

(57) ABSTRACT

A semiconductor lamination portion is formed on a substrate by laminating semiconductor layers so as to form a light emitting layer, and a plurality of light emitting units are formed by separating the semiconductor lamination portion electrically into a plurality of units. Each of the units has a pair of electric connecting portions which are connected to a pair of conductivity type layers and they are connected to each other with a wiring film. Each of the plurality of the light emitting units is separated electrically by dividing the conductivity type layers of the semiconductor lamination portion with at least twofold separating grooves (a first separating groove and a second separating groove). As a consequence, a semiconductor light emitting device with a high luminance and being formed in a monolithic type having a plurality of light emitting units can be obtained to solve a problem of a short-circuit occurrence between the light emitting units while keeping high reliability of wiring or the like.

11 Claims, 5 Drawing Sheets

F I G. 2
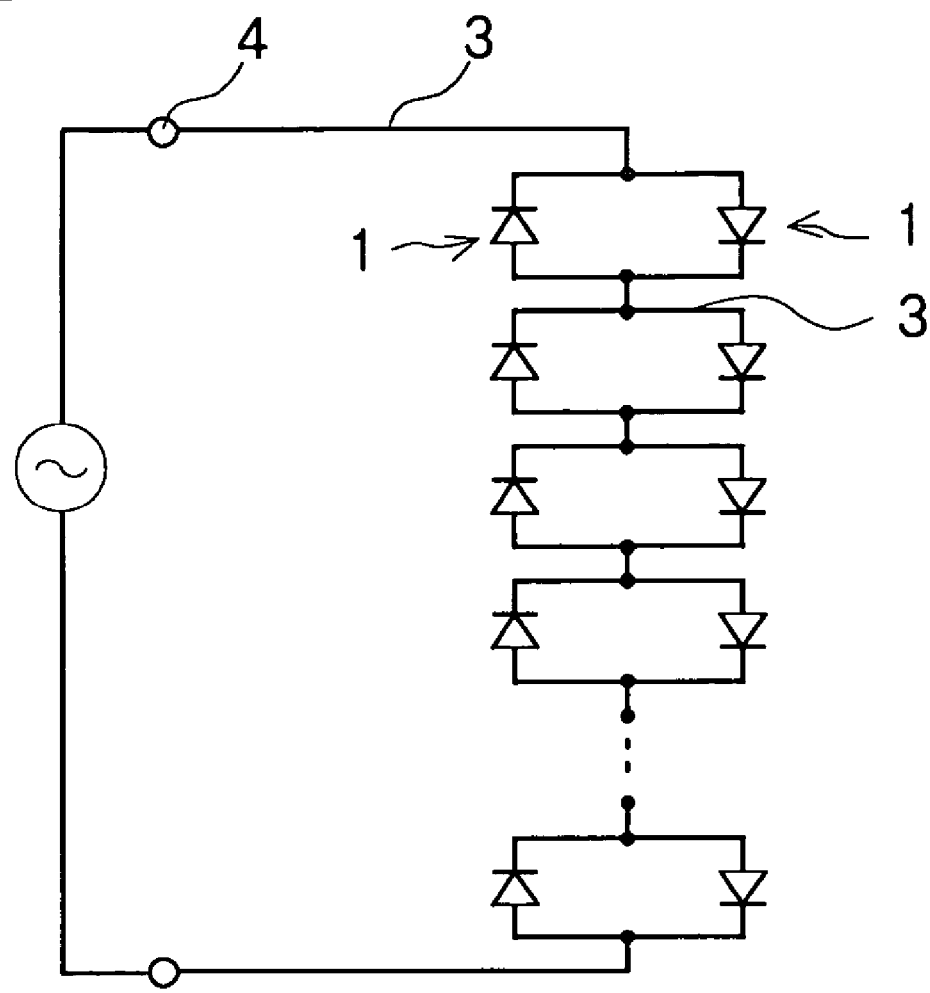

SEMICONDUCTOR LIGHT EMITTING DEVICE

FIELD OF THE INVENTION

The present invention relates to a semiconductor light emitting device in which a plurality of light emitting units are formed on a substrate and connected in series and/or parallel, and which can be used for light sources in place of incandescent lamps or fluorescent lamps used with commercial AC power sources of, for example, 100 V, or be used for signs or car-lights. More particularly, the present invention relates to a semiconductor light emitting device which has a structure with high reliability such that a problem of stopping operation of the light emitting device caused by a fault such as a short-circuit between the light emitting units hardly arises.

BACKGROUND OF THE INVENTION

Being accompanied with developing blue light emitting diodes (LEDs), LEDs are lately used for light sources of displays or traffic signals and furthermore become to be used in place of incandescent lamps or fluorescent lamps. As it is preferable that LEDs can be operated simply with AC driving of 100 V or the like in case that LEDs are used in place of incandescent lamps or fluorescent lamps, as disclosed, for example, in Japanese Patent Application Laid-Open No. HEI10-083701 and as shown in FIG. 5, a structure in which LEDs connected in series and/or parallel are connected to an AC power source 71 is known well. Here, S represents a switch.

On the other hand, integrating these LEDs connected in series and/or parallel into a monolithic type has been performed, as shown, for example, in Japanese Patent Application Laid-Open No. 2000-101136. In a structure shown in FIG. 6, for example, a semiconductor lamination portion is formed by, laminating, on a sapphire substrate 60, an i-GaN layer 61, an n-GaN contact layer 62, an n-AlGaN clad layer 63, an active layer 64 formed with an InGaN multi quantum well, a p-AlGaN clad layer 65, and a p-GaN contact layer 66 are laminated in order. And, followed, etching a part of the semiconductor lamination portion so as to expose the n-GaN contact layer 62, forming a groove 70 by etching a border part of adjacent LEDs up to the i-GaN layer 61, forming an $SiO_2$ film 67 in the groove 70, forming a transparent electrode 68 on the p-GaN contact layer 66, and forming a metal electrode 69 so as to connect the n-GaN contact layer 62 and the transparent electrode 68. And here it is also disclosed that the LEDs are connected to the AC power source 71 by connecting each of metal electrodes to a first power source wire and a second power source wire alternatively and are connected in parallel with reverse direction one by one.

As described above, a plenty of light emitting units are formed by separating grooves for separating each of light emitting units electrically after laminating semiconductor layers on the substrate in order to form a light emitting device with a plurality of LEDs connected in series and/or parallel in a monolithic type. And, as a wiring film is formed on the separating groove, when a width of the separating groove is wide, a problem of a break in wiring may arise. Therefore, the separating groove is formed very narrow with a width approximately 2 μm. On the other hand, a method of dry etching is necessary to be used for etching a nitride semiconductor layer, because it is very hard and stable. As a result, contaminations of etched semiconductor materials or the like generated in the etching process are easy to deposit and to be embedded in separating grooves previously being formed. As a result, the short-circuit occasionally arises due to the contaminations embedded in the separating groove, even if light emitting units are separated by forming the separating groves. Under the above-described condition, in case of the short-circuit between two vertically adjacent light emitting units as shown in FIG. 5, as only one light emitting unit becomes out of operating, a trouble is rather small. However, as an arrangement of the light emitting units is in a turned back structure or in a ring-shaped structure formed in a rectangular-shaped chip, the light emitting device does not work as a light source in case that the short-circuit through the semiconductor layer or the like arises between two light emitting units in one end and in another end or in a middle part of a series and/or parallel circuit.

On the contrary, if a width of separating grooves is made wider intending to enhance reliability in an electrical separation, wiring films become easy to break because insulating films are depressed into separating grooves, as wiring films are formed on a surface side of the semiconductor lamination portion intervening insulating films, and reliability of wiring films is reduced.

SUMMARY OF THE INVENTION

The present invention is directed to solve the above-described problems and an object of the present invention is to provide a semiconductor light emitting device including a plurality of light emitting units formed in a monolithic type and connected in series and/or parallel, wherein a problem of a fault such as the short-circuit or the like between the light emitting units hardly occurs and high reliability of a performance is achieved, while keeping reliability of wiring or the like in the semiconductor light emitting device improving in brightness.

Another object of the present invention is to provide a semiconductor light emitting device having a structure including a plurality of light emitting units formed in a monolithic type and connected in series and/or parallel, wherein reliability against a fault such as the short-circuit can be enhanced and an external quantum efficiency can be increased by increasing an efficiency of taking light out.

A semiconductor light emitting device according to the present invention includes: a substrate; a semiconductor lamination portion formed on the substrate by laminating semiconductor layers so as to form a light emitting layer; a plurality of light emitting units formed by separating the semiconductor lamination portion electrically into a plurality of units, each of the plurality of light emitting units having a pair of electric connecting portions which are connected to a pair of conductivity type layers of the semiconductor lamination portion, respectively; and wiring films which are connected to the electric connecting portions for connecting each of the plurality of light emitting units in series and/or parallel, wherein each of the plurality of light emitting units is separated electrically by dividing the conductivity type layers of the semiconductor lamination portion with at least a first separating groove and a second separating groove which is formed outside of the first separating groove.

One of the first and second separating grooves can be formed so as to separate electrically a group of light emitting units which includes two or more light emitting units from other light emitting unit or another group of light emitting units. Here, a group of light emitting units means one or more blocks of two light emitting units connected in parallel with reverse direction or two or more adjacent light emitting units connected in series. That is, each of the light emitting units may be separated by at least twofold separating grooves, or may be separated as a group including the plurality of the light emitting units separated by at least one separating groove, respectively by a second separating groove, because the short-circuit is limited only inside the block itself in case that the short-circuit occurs inside the block. Therefore the light emitting device can continue an operation as a whole and consequently any serious trouble does not arise.

At least a part of one of the first and second separating grooves can be formed in common with the separating groove of the adjacent light emitting unit or an adjacent group of light emitting units which includes two or more light emitting units.

At least a part of the semiconductor lamination portion between second separating grooves of the adjacent two of the light emitting units and groups of light emitting units, each of which includes two or more light emitting units can be removed, or a second dummy region can be formed by the semiconductor lamination portion left between the second separating grooves of adjacent two of the light emitting units and groups of light emitting units which include two or more light emitting units, and wherein at least a third separating groove is formed, in the second dummy region, thereby three or more separating grooves are formed in a row.

In case of removing the semiconductor lamination portion, it becomes easy to take light out, and in other case of forming the second dummy region by the semiconductor lamination portion being left, it contributes to promoting of heat dissipation and more, by adding the third separating groove, not only reliability of the electrical separation can be enhanced, but also the external quantum efficiency can be enhanced, as taking light out becomes easy because of increasing number of variations of refractive indices in the dummy region due to irregular variations of directions of light transmitting on a lateral direction.

More concretely, as the semiconductor lamination portion is formed to form the light emitting layer by laminating semiconductor layers made of a nitride semiconductor including an n-type layer, an active layer and a p-type layer, thereby a light emitting device for emitting a blue light or an ultraviolet light can be obtained, and by depositing a converting member of a light color or by mixing with other light emitted from a green or a red light emitting element, it is easy to convert to white color light and is used for a lighting device.

Here, the nitride semiconductor means a compound of Ga of group III element and N of group V element or a compound (nitride) in which a part or all of Ga of group III element substituted by other element of group III element like Al, In or the like and/or a part of N of group V element substituted by other element of group V element like P, As or the like.

According to the present invention, as at least twofold separating grooves are formed for each of the light emitting units, problems of short-circuits which occur in the separating grooves are considerably reduced. In other words, as each of the light emitting units is originally separated electrically by the separating grooves, the possibility of simultaneous short-circuit occurrence in two of twofold separating grooves is reduced to a very low rate by forming the separating grooves in twofold. On the other hand, as the separating grooves are formed so as to have a width of 0.6 to 5 μm, preferably 1 to 3 μm, an inside of the groove is filled up at least at a surface side in forming a protective film made of $SiO_2$ or the like and problems of break-circuits of wiring films which are formed on filled up grooves hardly occurs.

As a result, problems such that the short-circuit occurrence between the light emitting units or a break-circuit of the wiring hardly arise and a semiconductor light emitting device with high reliability can be obtained. In addition, in case that one of the twofold separating grooves is formed so as to work for a block of the plurality of adjacent light emitting units with an aspect of an electrical circuit, if the short-circuit occurs in the block, as the short-circuit is limited only between adjacent light emitting units with an aspect of an electrical circuit, a portion of the short-circuit is very small in reference to all light emitting units connected in series in 100V or the like and the light emitting device has no sever problems and an operation can be continued as a whole.

BRIEF DESCRIPTION OF THE DRAWINGS

FIG. 2 is a figure of an equivalent circuit showing an interconnection of light emitting units;

DETAILED DESCRIPTION

Figure 1A:
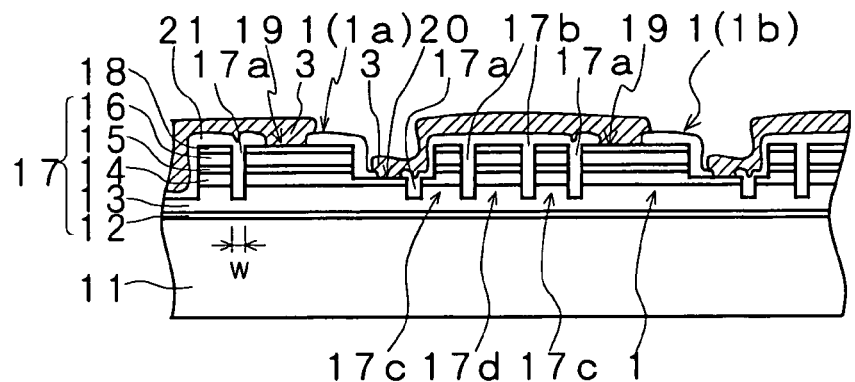
FIGS. 1A through 1C show a cross-sectional view and plane views explaining one embodiment of a semiconductor light emitting device according to the present invention.
Figure 1B:
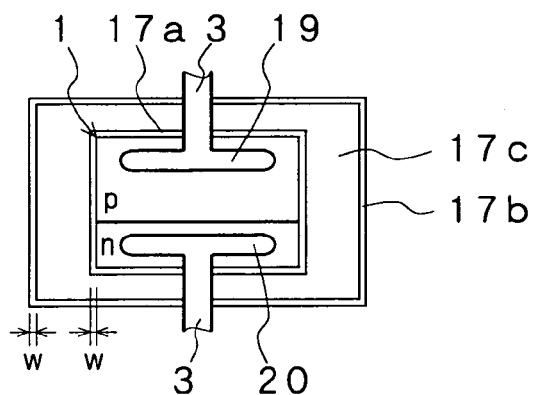
Figure 1C:
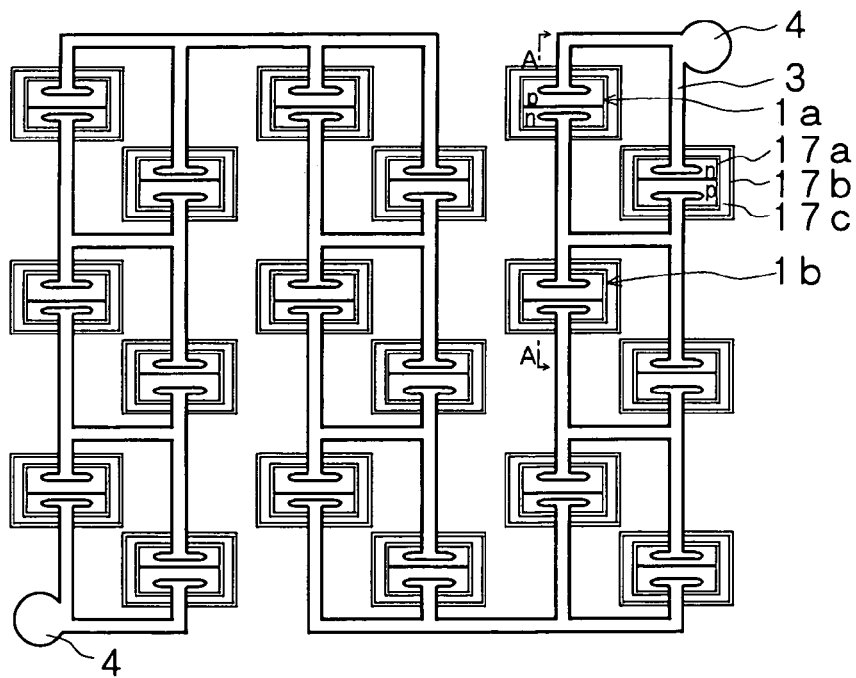

An explanation will be given below of a semiconductor light emitting device according to the present invention in reference to the drawings. FIGS. 1A through 1C are figures showing one embodiment of the semiconductor light emitting device according to the present invention, FIG. 1A is an explanatory figure showing a cross-sectional view (a cross-sectional view of A-A in FIG. 1C), FIG. 1B is an explanatory figure showing a plane view of one light emitting unit, and FIG. 1C is a explanatory figure showing a plane view of the whole example.

As shown in FIGS. 1A through 1C, the semiconductor light emitting device according to the present invention includes a semiconductor lamination portion 17 formed on a substrate 1 by laminating semiconductor layers so as to form a light emitting layer. The semiconductor lamination portion 17 is electrically separated into a plurality of light emitting units 1 (1a, 1b). Each of the plurality of light emitting units has a pair of electric connecting portions 19 and 20 which are connected to a pair of conductivity type layers of the semiconductor lamination portion 17, respectively. Wiring films 3 are connected to the electric connecting portions 19 and 20 for connecting each of the plurality of light emitting units in series and/or parallel. And each of the plurality of light emitting units 1 is separated electrically by dividing the conductivity type layers of the semiconductor lamination portion 17 with at least twofold separating grooves (a first separating groove 17a, a second separating groove 17b).

As shown in FIG. 1A, the first and the second separating grooves 17a and 17b are formed with a depth to reach to a high temperature buffer layer 13 which is a semi-insulating layer, or to expose a substrate 11, and, at the same tome, the first separating groove 17a is formed so as to surround each of the light emitting units 1 and additionally, as shown in FIG. 1B, the second separating groove 17b is formed in a same way so as to surround each of the light emitting units 1 through a buffer region 17c. The first and the second separating grooves 17a and 17b are formed with a width of approximately 0.5 to 5 μm, more preferably approximately 1 to 3 μm, for example approximately 2 to 3 μm, by etching the semiconductor lamination portion 17 with a method of dry etching. If this width is too small, an electrical separation of the conductivity type layers is not sufficient, and if the width is too large, problems like a break-circuit are easy to occur as the wiring film 3 is formed above the groove through a protective film. A clearance between the first and the second separating grooves 17a and 17b has no limitation. And the second separating groove 17b can be formed so as to surround each of the blocks described later, in stead of surrounding each of the light emitting units 1.

In an example shown in FIGS. 1A through 1C, a second dummy region 17d is formed with the semiconductor lamination portion 17 left as it is, in a part, surrounding the second separating groove 17b, of a portion where the wiring film 3 does not exist. However, it can be adopted that the semiconductor lamination portion 17 of the second dummy region 17d is removed up to a vicinity of the substrate 11, thereby it is easy to take light out. Or it can be adopted that any number of lines of grooves are formed in the second dummy region 17d, thereby light is easily taken out utilizing variations of a direction of light transmitting caused by a difference of a refractive index between the semiconductor lamination portion 17, and air or an insulating film. In this case, if grooves are not formed under wiring films 3, a width of the groove can be set freely to take light out easily, and if grooves are formed under the wiring films 3, too, as described later, by forming any number of narrow grooves like the first and the second separating grooves 17a and 17b, an efficiency of taking light out can be increased while enhancing a separating characteristics of electrical separation.

In the example shown in FIGS. 1A through 1C, the light emitting device radiating white light is formed by forming the light emitting unit 1 emitting blue light (hereinafter, referred to as simply "LED", too) laminated with the nitride semiconductor, and by depositing a converting member of light colors, not shown in Fig., like for example a phosphor of YAG (Yttrium Aluminium Garnet), a phosphor of Sr—Zn—La or the like. Therefore, the semiconductor lamination portion 17 is formed by laminating nitride semiconductor layers, as one example of a lamination structure shown by being simplified in FIG. 1. However, white light can be obtained by forming light emitting units of three primary colors, red, green and blue, too, and a light emitting portion with a desired light color can be also formed, and white light is not always necessary.

As a sapphire (single crystal $Al_2O_3$) or a SiC is generally used for the substrate 11 in case of laminating the nitride semiconductor, sapphire (single crystal $Al_2O_3$) is used in an example shown in FIG. 1. But a substrate is chosen from view point of a lattice constant or a thermal expansion coefficient depending upon semiconductor layers to be laminated on.

For example as shown in FIG. 1A, the semiconductor lamination portion 17 laminated on the sapphire substrate 11 is formed by laminating following layers in order, a low temperature buffer layer 12 made of GaN and having a thickness of approximately 0.005 to 0.1 μm, a high temperature buffer layer 13 made of un-doped GaN and having a thickness of approximately 1 to 3 μm, a contact layer 14 made of an n-type GaN doped with Si on the high temperature buffer layer 13 and a barrier layer (a layer with a large band gap energy) made of an n-type AlGaN based compound semiconductor and having a thickness of approximately 1 to 5 μm, for example approximately 2.9 μm, an active layer 15 which has a structure of a multiple quantum well (MQW) formed with a thickness of approximately 0.05 to 0.3 μm by laminating 3 to 8 pairs of well layers made of a material having a band gap energy lower than that of the barrier layer, for example $In_{0.13}Ga_{0.87}N$ and having a thickness of 1 to 3 nm, and barrier layers made of GaN and having a thickness of 10 to 20 nm, and a p-type layer 16 formed with a p-type barrier layer (a layer with a large band gap energy) made of a p-type AlGaN based compound semiconductor and the contact layer made of a p-type GaN, and having a thickness of approximately 0.2 to 1 μm in total, for example 0.6 μm. In figures, a height of a surface of a light transmitting conductive layer 18 in reference to an exposed surface of the n-type layer 14 is represented with an enlarged view, but actually it is approximately 1.5 to 2 μm and much smaller than that of total semiconductor lamination portion 17 of 6.5 μm.

In an example shown in FIG. 1A, the high temperature buffer layer 13 is formed with GaN which is un-doped and semi-insulating. In case that the substrate is made of an insulating substrate like sapphire, it is not always necessary for the high temperature buffer layer to be semi-insulating because there is no problem if separating grooves are etched up to the substrate as described later, but an un-doped type is preferable because a crystal structure of the semiconductor layer laminated on that is superior, and more, by providing with semi-insulating semiconductor layers, the electrical separation can be obtained without etching up to the substrate surface when each of the light emitting units is separated. And in case that the substrate 11 is made of a semiconductor substrate like SiC, it is necessary to form the high temperature buffer layer 13, un-doped and semi-insulating, for separating adjacent light emitting portions electrically in order to make each of light emitting units independent.

The n-type layer 14 and the p-type layer 16 contain two kinds of the barrier layer and the contact layer in the above-described example, but only a GaN layer or a AlGaN based compound layer can be used sufficiently, although it is preferable with an aspect of carrier confinement effect to form a layer including Al at a side of the active layer 6. Or, these can be formed with other nitride semiconductor layers or other semiconductor layers can be interposed. Although, in this example, a double hetero structure is shown in which the active layer 15 is sandwiched by the n-type layer 14 and the p-type layer 16, a structure of a p-n junction can be used in which the n-type layer and the p-type layer are directly joined. Further, although a p-type AlGaN based compound layer is formed directly on the active layer 15, an un-doped AlGaN based compound layer of approximately several nm thicknesses can be laminated on the active layer 15. Thereby, a leakage caused by a contact of the p-type layer and the n-type layer can be avoided while embedding pits created in the active layer 15 by forming a pit-creating layer under the active layer 15.

The light transmitting conductive layer 18 which is formed with for example ZnO or the like and makes an ohmic contact with the p-type semiconductor layer 16 is formed with a thickness of approximately 0.01 to 0.5 μm on the semiconductor lamination portion 17. A member of this light transmitting conductive layer 18 is not limited to ZnO, ITO (Indium Tin Oxide) or a thin alloy layer of Ni and Au having a thickness of approximately 2 to 100 nm can be used and diffuse current to whole part of a chip while transmitting light. A first separating groove 17a is formed by removing a part of the semiconductor lamination portion 17 by etching so as to expose the n-type layer 14, and by further etching the n-type layer 14 at an end side of the exposed portion and the high temperature buffer layer 13 near to the substrate 1 with a width (W) of 0.6 to 5 μm, for example 2 to 3 μm. In this example, the second separating groove is formed with same width and same depth as that of the first separating groove 17a, having a space of a first dummy region 17c. Although the second dummy region 17c is left between the second separating grooves 17b of adjacent light emitting units 1, it is possible to make taking light out easier by removing the semiconductor lamination portion 17 of this part, as described above.

After forming a protective film 21 of $SiO_2$ or the like on a whole surface of the translucent conductive layer 18 and the exposed surface of the n-type layer 14, a p-side connecting portion 19 and an n-side connecting portion 20 are exposed by a patterning process. Thereafter, the wiring film 3 is formed to connect light emitting units in series or in parallel, by depositing a Ti film which is a material of the wiring film 3 by a method of lift-off, by depositing an Al film and alloying with the electrical connecting portion 20 to be connected to the n-type layer 14, and by forming an Au film on the other wiring portion. The wiring film 3 is made of Au, Al or the like having a thickness of approximately 0.3 to 1 μm by a method of evaporating or sputtering. Namely, electrodes and wiring films are formed with the same material and at the same time. And it can be allowed that the n-side and the p-side electrodes are formed with, for example, a Ti—Al alloy or a Ti/Al lamination structure and that the wiring film is formed with other materials.

For example, as shown in FIG. 1A, a bright light source driven with 100 V AC can be obtained by connecting sequentially the n-side connecting portion 20 of one light emitting unit 1a and the p-side connecting portion 19 of an adjacent light emitting unit 1b, separated by the first and the second separating grooves 17a and 17b, respectively in order, and by connecting light emitting units to a number of making a total voltage of operation voltages 3.5 to 5 V per one light emitting unit approximately 100 V (a precise adjustment is made by adding a resistor or a capacitor in series), and connecting the groups in parallel in reverse directions of p-side and n-side. As an example of arranging light emitting units 1 is shown in FIG. 1c, pairs of light emitting units connected in parallel in reverse direction of p-n junction can be connected in series to a number of making a total operation voltage approximately 100V AC. The above described structure is represented by an equivalent circuit shown in FIG. 2. And if a luminance by this connection is not sufficient, more groups of the same type can be connected in parallel.

And next, an explanation on a method for manufacturing the semiconductor light emitting device with a structure shown in FIG. 1A will be given below. A semiconductor lamination portion is formed by a method of metal organic compound vapor deposition (MOCVD), supplying necessary gasses such as a reactant gas like trimethyl gallium (TMG), ammonia ($NH_3$), trimethyl aluminium (TMA), trimethyl indium (TMI) or the like, and a dopant gas like $SiH_4$ for making an n-type, or a dopant gas like biscyclopentadienyl magnesium ($Cp_2Mg$).

At first, for example, the low temperature buffer layer 12 made of a GaN is deposited with a thickness of approximately 0.005 to 0.1 μm on the sapphire substrate 11, for example, at a temperature of approximately 400 to 600° C., thereafter, a high temperature buffer layer 13 of semi-insulating and made of an un-doped GaN with a thickness of approximately 1 to 3 μm and the n-type layer 14 formed of the GaN layer doped with Si and the AlGaN based compound semiconductor layer doped with Si with a thickness of approximately 1 to 5 μm are formed, at an elevated temperature of for example approximately 600 to 1200° C.

And at a lowered temperature of 400 to 600° C., an active layer 6 is formed which has a structure of a multiple quantum well (MQW) formed with a thickness of approximately 0.05 to 0.3 μm by laminating 3 to 8 pairs of well layers made of, for example, $In_{0.13}Ga_{0.87}N$ and having a thickness of 1 to 3 nm, and barrier layers made of GaN and having a thickness of 10 to 20 nm.

And, elevating a temperature in a growth furnace to approximately 600 to 1200° C., the p-type layer 16 doped with $Cp_2Mg$ including the p-type AlGaN based compound semiconductor layer and GaN layer are laminated 0.2 to 1 μm thick in total.

After, by forming a protective film made of $Si_3N_4$ or the like and annealing at a temperature of approximately 400 to 800° C. and for 10 to 60 minutes to activate the p-type dopant, a light transmitting conductive layer 18 is formed on a surface with, for example, a ZnO layer approximately 0.1 to 0.5 μm thick by a method of MBE, sputtering, evaporation, PLD, ion plating or the like. Successively, in order to form the n-type electrode 20, a part of the semiconductor lamination portion 17 is etched by a method of a reactive ion etching with chlorine gas so as to expose the n-type layer 14. And in order to form the first and second separating grooves 17a and 17b, by forming a mask having openings at places where grooves are formed, and etching by a method of dry etching, the first and second separating grooves 17a and 17b are formed intervening the first dummy region 17c and surrounding each of the light emitting units. Both of the first and the second separating grooves 17a and 17b are formed through the n-type layer up to the semi-insulating layer (the high temperature buffer layer 13) or the substrate 11 of a insulating material.

Next, the p-side connecting portion 19 and the n-side connecting portion 20 are formed by exposing a part of the light transmitting conductive layer 18 and a part of the n-type layer 14 by patterning an insulating film 21 made of $SiO_2$ or the like formed on the whole surface. And using a method of lift-off, the wiring films 3 are formed to connect to the n-side connecting portion 20 and to the p-side connecting portion 19 by depositing Ti and Al continuously with a thickness of approximately 0.1 and approximately 0.3 μm respectively by a method of sputtering or evaporating, and by heating at approximately 600° C. for 5 minutes to make an alloy. The wiring films 3, as described above, are formed so as to connect the light emitting unit 1 in a desired manner.

In case that property of an ohmic contact of the p-side connecting portion 19 is not sufficient, Ti and Au can be deposited on the p-side connecting portion 18 with a thickness of 0.1 to approximately 0.3 μm respectively, and the wiring films 3 may be connected to the metal layers. And also, Au film may be formed on the whole surface of wiring films 3. These are formed easily by the method of lift-off. A chip of the semiconductor light emitting device is obtained by dicing a wafer to get each of elements including groups of the light emitting units which includes a plurality of light emitting units 1, wiring films 3 and electrode pads 4. When the wiring films 3 are formed, as shown in FIG. 1C, electrode pads 4 for connecting to outside are formed with the same material and at the same time.

Figure 3A:
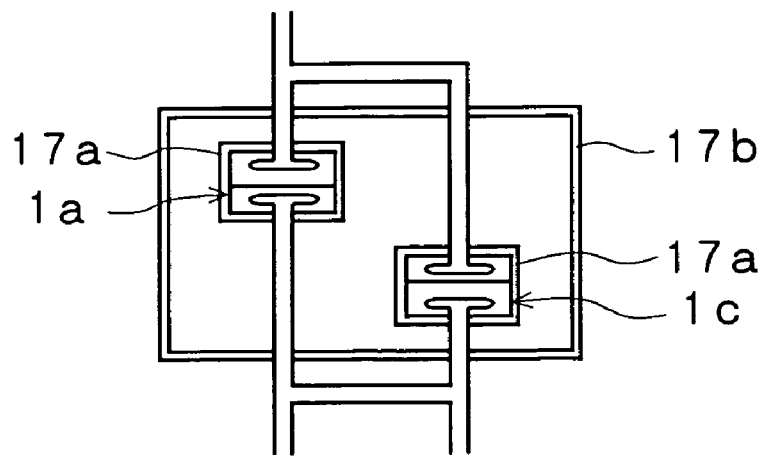
FIGS. 3A and 3B show cross-sectional views explaining another embodiment of a semiconductor light emitting device according to the present invention.
Figure 3B:
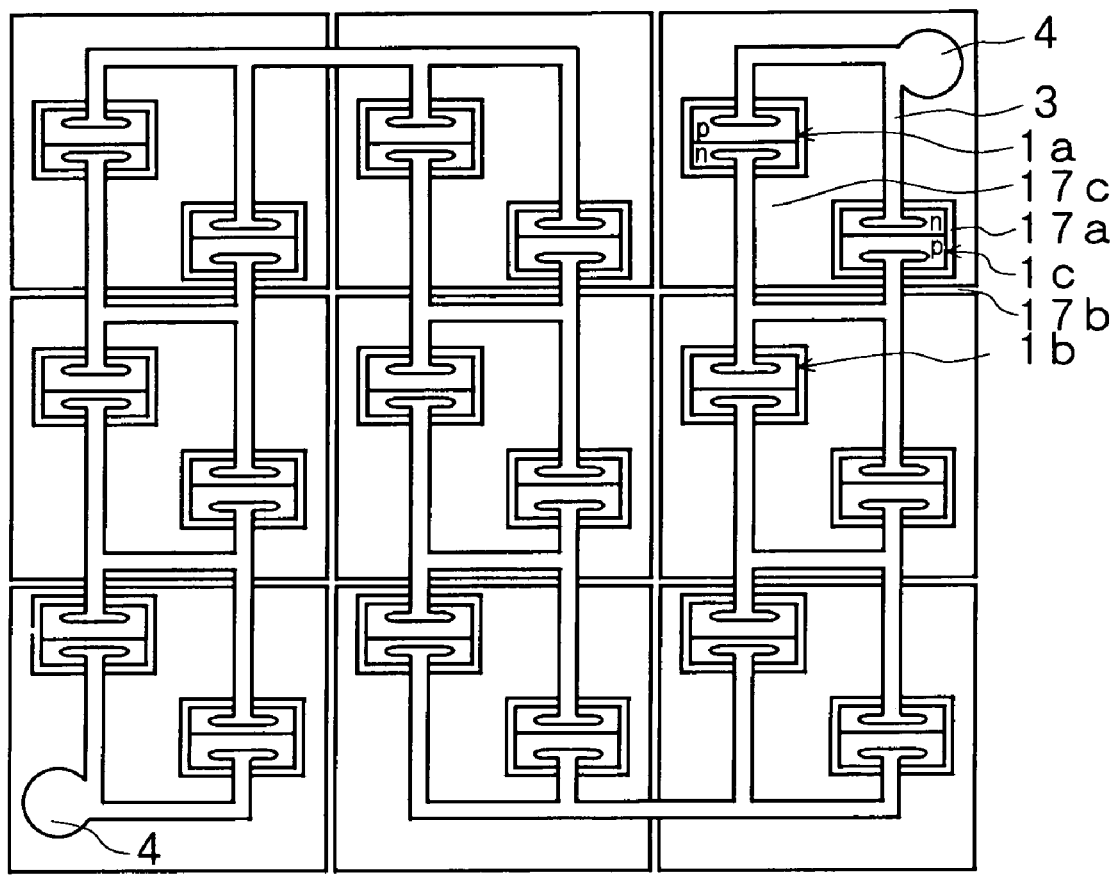

In the above described example, the second separating groove 17b is formed outer the first separating groove so as to surround each of the light emitting units 1, but the second separating groove 17b is not necessary to surround every each of light emitting units, and it is allowed to surround each of blocks. One example of the above described structures is shown in FIGS. 3A and 3B. In FIGS. 3A and 3B, by making one block with two light emitting units 1a and 1c connected in parallel with reverse direction, the second separating groove is formed so as to surround these two light emitting units 1a and 1c. Of course, the first separating groove 17a is formed around each of the light emitting units 1a and 1c, and, for example, the light emitting unit 1a is separated two times by the first and the second separating grooves 17a and 17b. In FIG. 3B, an example of a configuration of whole blocks of the light emitting units 1 is shown. A configuration of blocks is not limited to this example, for example, two or several light emitting units connected in series can be allowed as the block, and a plurality of groups composed of a pair of two light emitting units connected in parallel with reverse direction can be a block, too.

In case of forming the second separating groove 17b for the groups, if separation by the first separating groove 17a is not sufficient in the block, a problem of a short-circuit between the light emitting units arises. However as an operation voltage of the light emitting unit 1 is approximately 3 V and actually light emitting units are connected in series so that a total operation voltage is nearly 100 V, even if two or three of light emitting units become to short-circuit, an influence to operation of the light emitting device as a whole is not sever. So, in order to increase a degree of integration, by reducing a number of the second separating grooves 17b by forming for blocks, more number of light emitting units 1 can be formed in a small area.

Figure 4A:
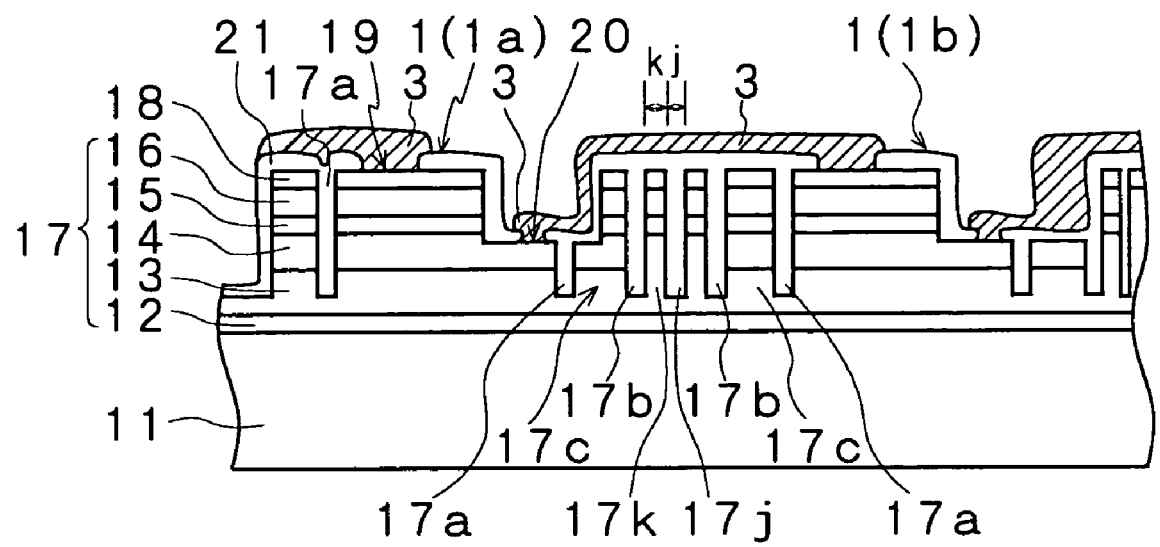
FIGS. 4A through 4C show cross-sectional views explaining further another embodiment of a semiconductor light emitting device according to the present invention.
Figure 4B:
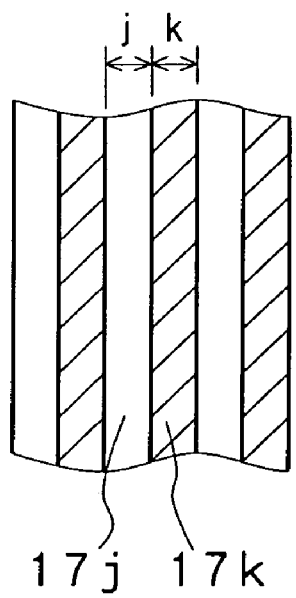

FIG. 4A is a cross-sectional explanatory view, same as FIG. 1A, showing another embodiment of a semiconductor light emitting device according to the present invention. In an example shown in FIG. 4A, a plurality of third separating grooves 17j is formed in the second dummy region (a region between each of the second separating grooves of the light emitting units 1) in a row intervening portions 17k being left (in FIG. 4A, only a pair of the third separating groove 17j and the portion 17k being left are represented, but actually a plurality of those are formed). As an explanatory plane view is shown in FIG. 4b, a width of the third separating groove 17j is approximately 0.6 to 5 µm, preferably approximately 1 to 3 µm, same as those of the first and the second separating grooves 17a and 17b and a width k of the portion 17k being left is approximately 1 to 3 µm, too.

By forming the third separating groove 17j, a light which is emitted from the light emitting unit 1 and passes through in lateral direction changes directions of passing because a refractive index of the dummy region 17c or the portion 17k being left is different from that of the third separating groove 17j (being embedded by the insulating film 21), and then it becomes easy to take light out, resulting in increasing the external quantum efficiency. In other words, as the refractive index of the insulating film 21 made of for example $SiO_2$ or the like is approximately 1.5 to 1.7 which is smaller than that of the nitride semiconductor layer, approximately 2.5 to 2.7, a direction of light is changed in reflection or refraction by a difference of these refractive indices and it becomes easy for light to go out.

Figure 4C:
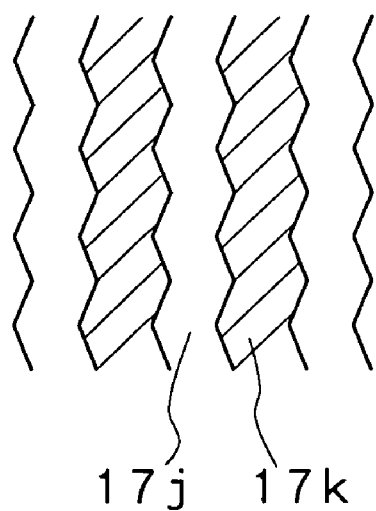
Figure 5:
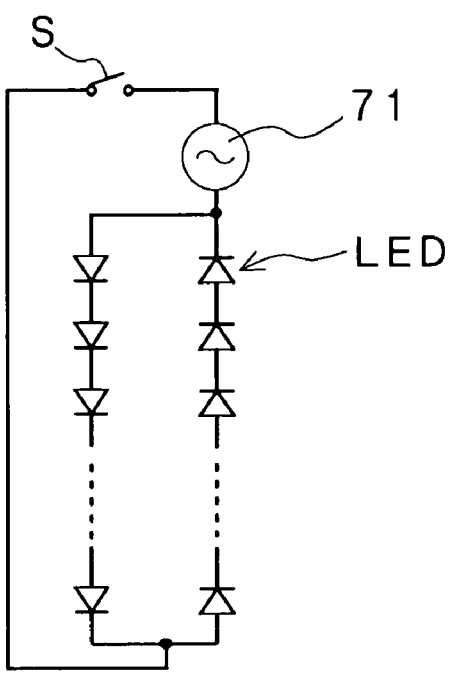
FIG. 5 shows an example of a conventional circuit showing an illumination device by using LEDs.
Figure 6:
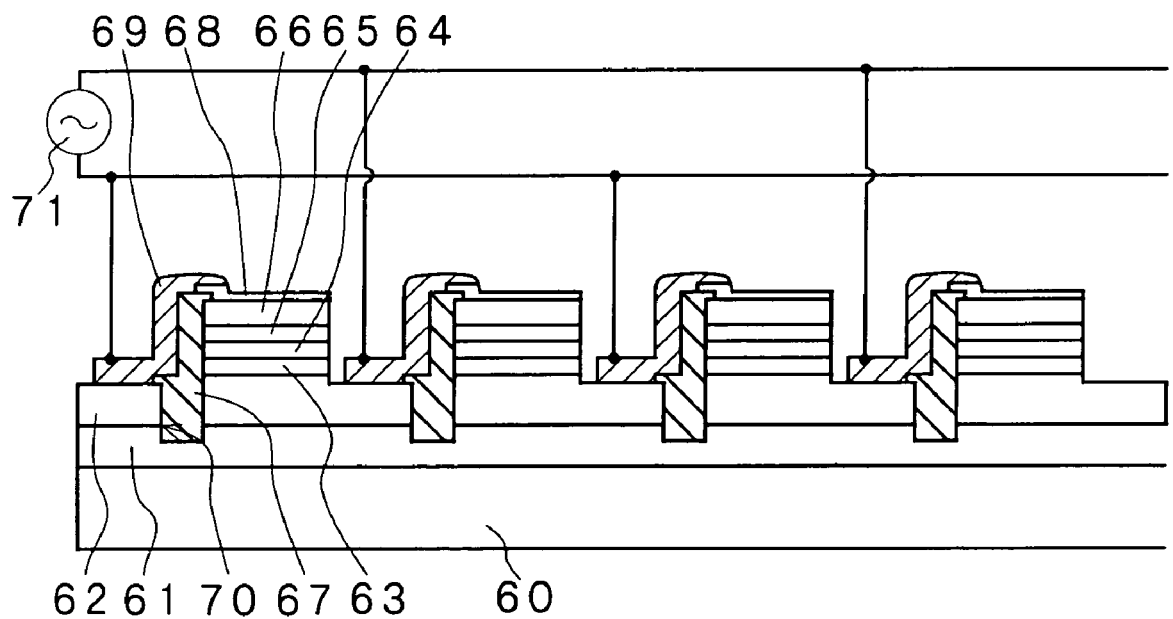
FIG. 6 shows an example of a conventional structure showing an illumination device by using monolithic LEDs.

On the other hand, a width j of the third separation groove 17j is very narrow as described above, even the wiring film 3 is formed over it, there is no worry about the break-circuit of the wiring film 3, because the insulating film 21 is embedded inside of the third separating groove 17j. As an explanatory plane view is shown in FIG. 4B, the third separation groove 17j is formed in a row, and as shown in FIG. 4C, it is preferable to be formed so as to have a plane view of a zigzag shape, because a direction of passing of light can be changed easily and an efficiency of taking light out is increased. The third separating grooves 17j are formed very easily by etching with providing only a mask made with a resist film or the like which has opening patterns of linear grooves or zigzag-shaped grooves, in a step of etching the semiconductor lamination portion 17 by a method of dry etching or the like, same as in forming the first and second separating grooves 17a and 17b.

As described above, according to the present invention, a fault like a short-circuit between the light emitting units hardly arises, even if the short-circuit arises by an insulating destruction of an insulating film caused by, for example, surge or the like, only one or two light emitting units in which a destruction arises become out of order, and in case that, for example, two of 48 light emitting units become out of order, a semiconductor light emitting device still operates with only decreasing luminance by approximately 5 percent, instead that a luminance of almost all part decreases depending upon a place of the insulating destruction in a conventional structure. As a result, the present invention contributes to increasing yield and lengthening life period and promotes reliability. Additionally, capability of withstanding surge of chips can be increased as a whole.

Although preferred examples have been described in some detail it is to be understood that certain changes can be made by those skilled in the art without departing from the spirit and scope of the invention as defined by the appended claims.

What is claimed is:

1. A semiconductor light emitting device comprising:
   a substrate;
   a semiconductor lamination portion formed on the substrate by laminating semiconductor layers so as to form a light emitting layer;
   an insulating layer or a semi-insulating layer provided on a substrate side of the semiconductor lamination portion, the insulating layer or the semi-insulating layer being a part of the substrate or a layer deposited on the substrate;
   a plurality of light emitting units formed by separating the semiconductor lamination portion by a first separating groove which reaches to the insulating layer or the semi-insulating layer to form electrically isolated areas, each of the plurality of light emitting units being encircled by said first separating groove having a pair of electric connecting portions which are connected to a pair of p-type and n-type conductivity layers of the semiconductor lamination portion respectively; and
   wiring films which are connected to the electric connecting portions for connecting each of the plurality of light emitting units in series and/or parallel,
   wherein at least one of the plurality of light emitting units encircled respectively by the first separating groove are encircled by a second separating groove which reaches to the insulating layer or the semi-insulating layer and is formed outside of the first separating groove and sufficiently distant therefrom so as to separate electrically the semiconductor lamination portion, and
   wherein each of the first and second separating grooves has a width of 0.6 µm to 5 µm and an insulating film is filled in an inside of at least a surface side of the groove, and at least one of the wiring films pass on the insulating film through the first and second separating grooves.

2. The semiconductor light emitting device according to claim 1, wherein the second separating groove is formed so as to separate electrically a group of light emitting units which includes two or more light emitting units from other light emitting unit or another group of light emitting units.

3. The semiconductor light emitting device according to claim 2, wherein the group of light emitting units includes two light emitting units which are connected in parallel with reverse direction.

4. The semiconductor light emitting device according to claim 1, wherein at least a part of one of the first and second separating grooves is formed in common with a separating groove of an adjacent light emitting unit or an adjacent group of light emitting units which includes two or more light emitting units.

5. The semiconductor light emitting device according to claim 1, wherein at least a part of the semiconductor lamination portion between the second separating grooves of the adjacent two of the light emitting units and groups of light emitting units, each of which includes two or more light emitting units is removed.

6. The semiconductor light emitting device according to claim 1, wherein a second dummy region is formed by the semiconductor lamination portion left between the second separating grooves of adjacent two of the light emitting units and groups of light emitting units which include two or more light emitting units, and wherein at least a third separating groove is formed, in the second dummy region, thereby three or more separating grooves are formed in a row.

7. The semiconductor light emitting device according to claim 6, wherein at least one of the first to the third separating grooves is formed so as to have a plane view of a zigzag shape.

8. The semiconductor light emitting device according to claim 6, wherein the third separating groove is not formed under a wiring film.

9. The semiconductor light emitting device according to claim 1, wherein the semiconductor lamination portion is formed to form a light emitting layer by laminating semiconductor layers made of the nitride semiconductor including an n-type layer, an active layer and a p-type layer.

10. The semiconductor light emitting device according to claim 1, wherein a semi-insulating layer made of a nitride semiconductor is formed on the substrate side of the semiconductor lamination portion.

11. The semiconductor light emitting device according to claim 9, wherein the semiconductor lamination portion is formed so as to emit a blue light or an ultraviolet light and a converting member of a light color which converts the blue light or the ultraviolet light to a white light is provided on a surface of the semiconductor lamination portion.

* * * * *